United States Patent
Iwao (10) Patent No.: US 6,734,547 B2
(45) Date of Patent: May 11, 2004

(54) SEMICONDUCTOR WIRING STRUCTURE HAVING DIVIDED POWER LINES AND GROUND LINES ON THE SAME LAYER

(75) Inventor: Takenobu Iwao, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/212,063

(22) Filed: Aug. 6, 2002

(65) Prior Publication Data

US 2003/0052341 A1 Mar. 20, 2003

(30) Foreign Application Priority Data

Sep. 19, 2001 (JP) ........................................ 2001-285520

(51) Int. Cl.[7] .............................................. H01L 23/48
(52) U.S. Cl. ........................ 257/692; 257/692; 257/775
(58) Field of Search ................................ 257/691, 692, 257/775, 207

(56) References Cited

U.S. PATENT DOCUMENTS 4,937,649 A * 6/1990 Shiba et al.

6,172,305 B1 * 1/2001 Tanahashi .................... 174/255
6,177,294 B1 * 1/2001 Nakatake

FOREIGN PATENT DOCUMENTS

| JP | 7-58301 | 3/1995 |
| JP | 8-307056 | 11/1996 |
| JP | 2000-124319 | 4/2000 |

* cited by examiner

*Primary Examiner*—Fetsum Abraham
(74) *Attorney, Agent, or Firm*—Burns, Doane, Swecker & Mathis, L.L.P.

(57) ABSTRACT

A semiconductor integrated circuit device comprises vertical power supply wiring 12 divided into first and second narrow-width vertical power supply wirings 12*a* and 12*b*, vertical ground wiring 14 disposed in parallel with vertical power supply wiring 12 and divided into first and second narrow-width vertical ground wirings 14*a* and 14*b*, auxiliary vertical power supply wiring 22 connecting first narrow-width vertical power supply wiring 12*a* and second narrow-width vertical power supply wiring 12*b*, and auxiliary vertical ground wiring 24 connecting first narrow-width vertical ground wiring 14*a* and second narrow-width vertical ground wiring 14*b*.

5 Claims, 7 Drawing Sheets

SEMICONDUCTOR WIRING STRUCTURE HAVING DIVIDED POWER LINES AND GROUND LINES ON THE SAME LAYER

BACKGROUND OF THE INVENTION

1. Field of the Invention

The present invention relates to a semiconductor integrated circuit device.

2. Description of the Prior Art

Figure 1:
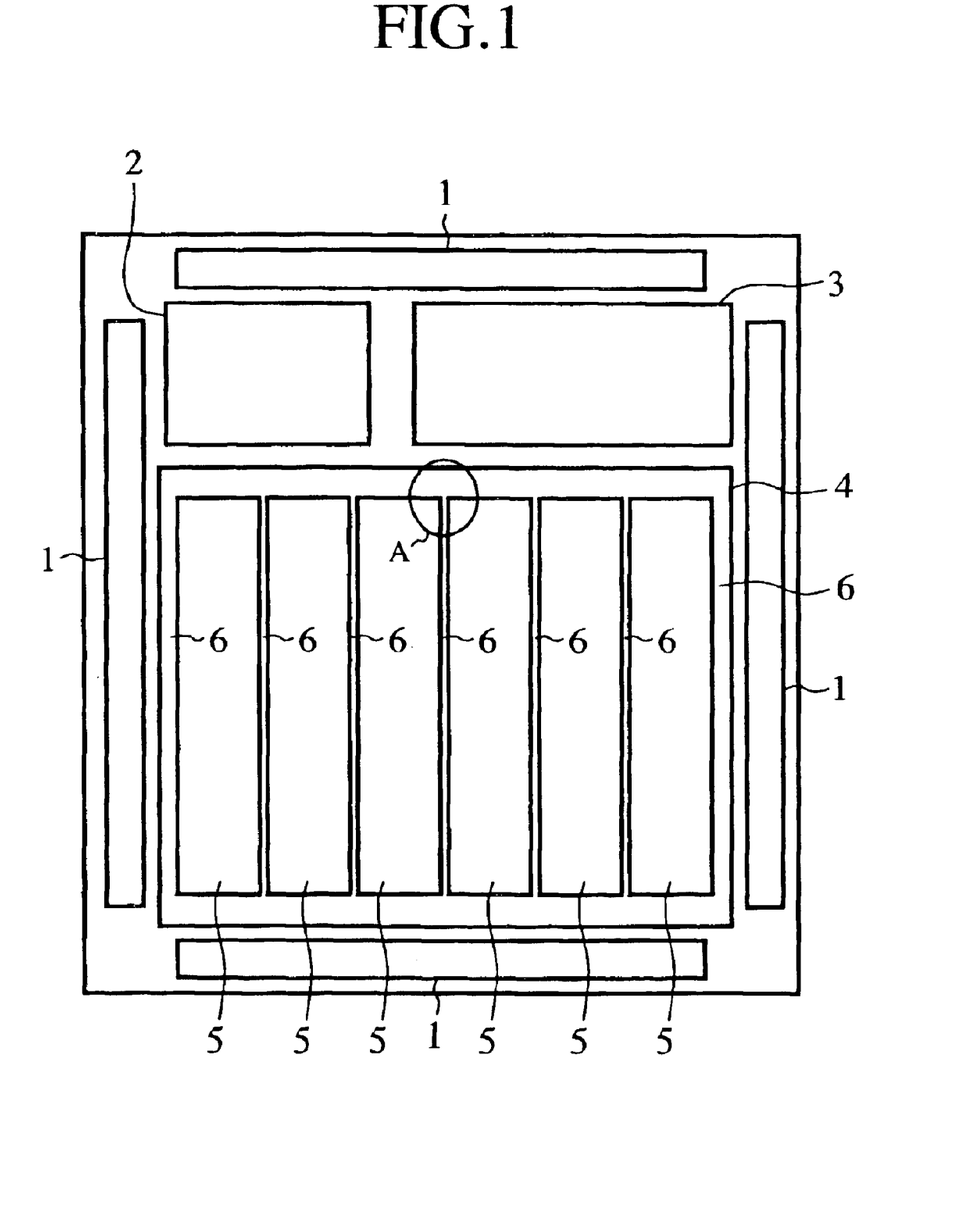
FIG. 1 is a layout view of a semiconductor integrated circuit device.

FIG. 1 is a layout view of a semiconductor integrated circuit device. Shown in FIG. 1 are I/O area 1 where an I/O buffer was formed, ROM area 2 where ROM was formed, RAM area 3 where RAM was formed, logic area 4 where a logic circuit was formed, logic element area 5 where a logic element was formed within logic area 4, and power supply/ground wiring area 6 where power supply wiring and ground wiring were formed within logic area 4.

Figure 6:
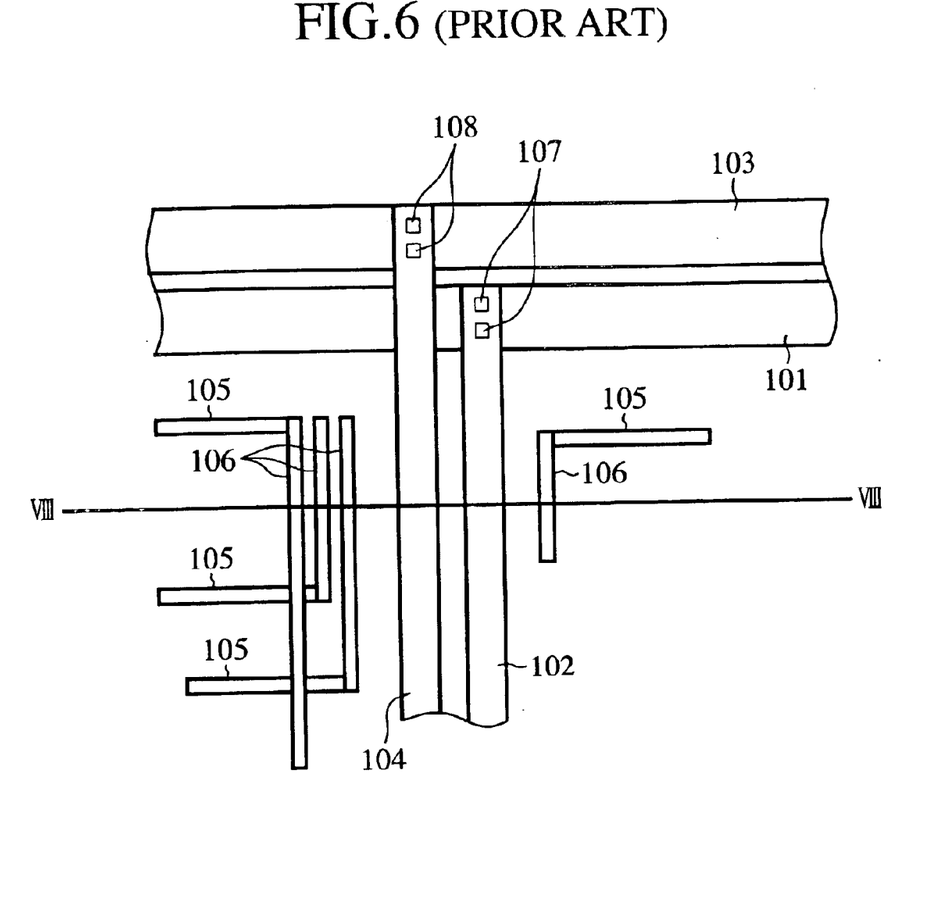
FIG. 6 is a plan view showing the configuration of wiring within the logic area of a conventional semiconductor integrated circuit device.

FIG. 6 is a plan view showing the configuration of wiring within the logic area of a conventional semiconductor integrated circuit device, and the figure corresponds to the configuration of "A" part in FIG. 1. Shown in FIG. 6 are horizontal power supply wiring 101, vertical power supply wiring 102, horizontal ground wiring 103 disposed in parallel with horizontal power supply wiring 101, vertical ground wiring 104 disposed in parallel with vertical power supply wiring 102, horizontal inter-element wirings 105 used for the connection between logic elements, vertical inter-element wirings 106 used for the connection between logic elements, through holes 107 used for the connection between horizontal power supply wiring 101 and vertical power supply wiring 102, and through holes 108 used for the connection between horizontal ground wiring 103 and vertical ground wiring 104.

The power supply wiring, the ground wiring, and the inter-element wiring are formed of metal such as aluminum or copper, for instance. The power supply wiring and the ground wiring have a width that is larger than the width of the inter-element wiring such that the power supply wiring and the ground wiring have resistance to electromigration.

Figure 7A:
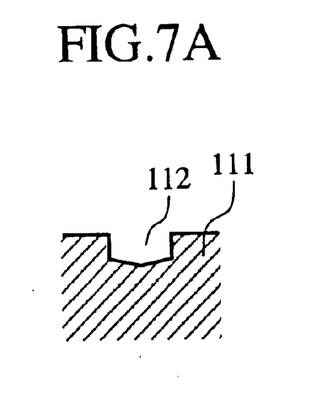
FIG. 7 is a sectional view showing the process of etching and dissolving an interlayer insulation film.
Figure 7B:
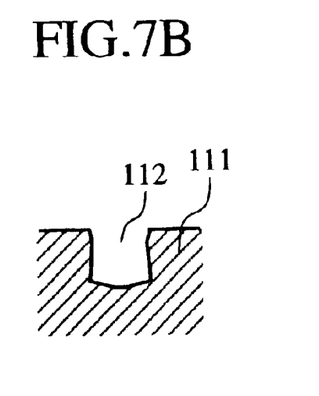
Figure 7C:
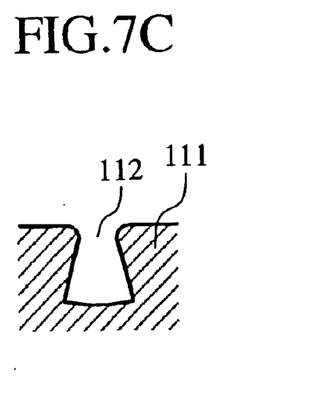

The power supply wiring, ground wiring, and inter-element wiring are formed by etching and dissolving interlayer insulation film at the position where these wiring are formed, to form holes and then burying metal such as aluminum or copper in the holes. FIG. 7 is a sectional view showing the process of etching and dissolving the interlayer insulation film. The etching of interlayer insulation film 111 proceeds in the order of from FIG. 7A to FIG. 7C. As shown in FIGS. 7A–7C, as the etching of interlayer insulation film 111 proceeds, a foreign substance is deposited on the entrance of hole 112, and thereby the sectional shape of hole 112 becomes trapezoidal. Accordingly, the power supply wiring, ground wiring, and inter-element wiring each have a trapezoidal sectional shape. The wider the width of the wiring is, the wider the taper part of the trapezoid is.

Figure 8:
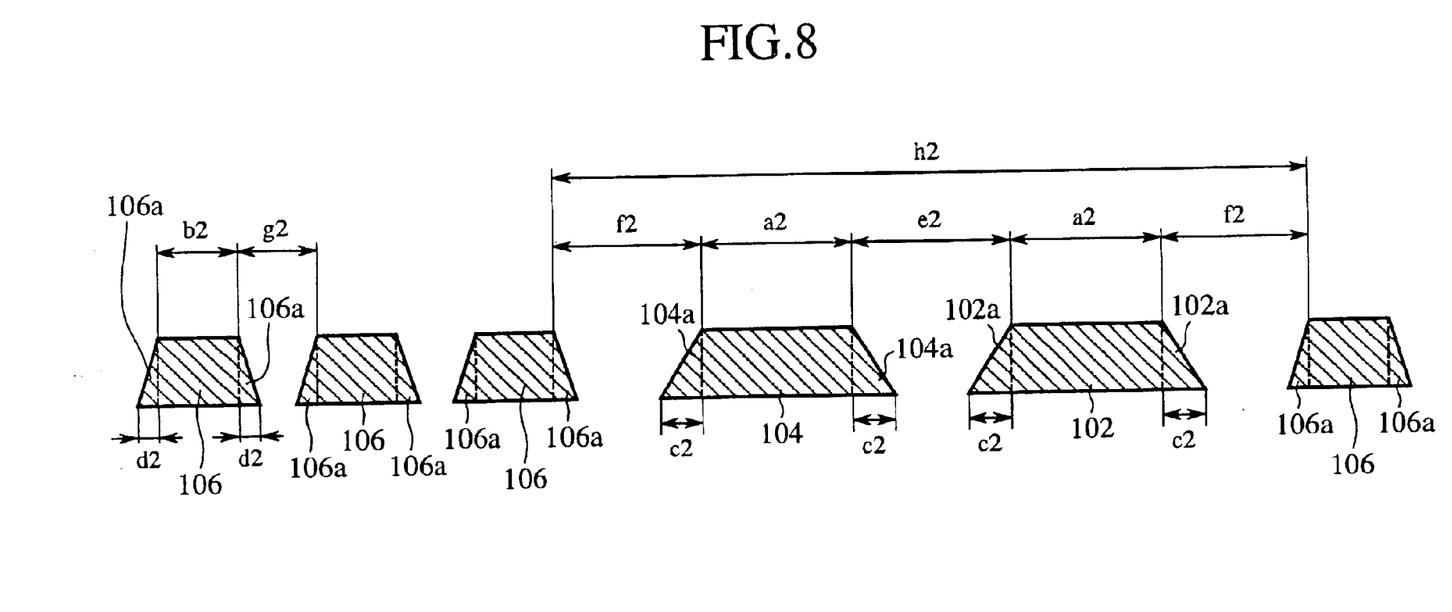
FIG. 8 is a sectional view taken along the VIII—VIII line of FIG. 6.

FIG. 8 is a sectional view taken along the VIII—VIII line of FIG. 6. Shown in the figure are taper parts 102a of vertical power supply wiring 102, taper parts 104a of vertical ground wiring 104, and taper parts 106a of vertical inter-element wirings 106.

Widths a2 of vertical power supply wiring 102 and vertical ground wiring 104 are wider than width b2 of vertical inter-element wiring 106. For instance, width a2 is about 0.41 μm, and width b2 is about 0.22 μm. For this reason, widths c2 of taper part 102a of vertical power supply wiring 102 and of taper part 104a of vertical ground wiring 104 are wider than width d2 of taper part 106a of vertical inter-element wiring 106. Accordingly, intervals f2 between vertical power supply wiring 102 and vertical inter-element wiring 106, and between vertical ground wiring 104 and vertical inter-element wiring 106 are wider than interval g2 between vertical inter-element wirings 106. Moreover, interval e2 between vertical power supply wiring 102 and vertical ground wiring 104 is wider than interval f2. Interval e2 is about 0.5 μm, interval f2 is about 0.4 μm, and interval g2 is about 0.22 μm, for instance. Interval h2 between vertical inter-element wiring 106 that is adjacent to vertical power supply wiring 102 and vertical inter-element wiring 106 that is adjacent to vertical ground wiring 104 is 2*a2+e2+2*f2, and is about 2.12 μm.

The conventional semiconductor integrated circuit device is arranged as mentioned above, the sectional shapes of power supply wiring, ground wiring, and inter-element wiring are trapezoidal, and the widths of the taper parts of a power supply wiring and a ground wiring that each have a wide width are wider than the width of the taper part of an inter-element wiring having a narrow width. For this reason, it is necessary to make the intervals between the inter-element wiring and the power supply wiring, and between the inter-element wiring and the ground wiring wider than the interval between the inter-element wirings. Accordingly, there has been a drawback that the wiring density of the inter-element wirings is low, and simultaneously the element density of the logic elements is low.

SUMMARY OF THE INVENTION

The present invention has been accomplished to solve the above-mentioned drawback. An object of the present invention is to provide a semiconductor integrated circuit device in which the intervals between an inter-element wiring and a power supply wiring, and between an inter-element wiring and a ground wiring are narrow, and the element density of logic elements is high.

According to a first aspect of the present invention, there is provided a semiconductor integrated circuit device including: a power supply wiring divided into a plurality of narrow-width power supply wirings; a ground wiring disposed in parallel with the power supply wiring and divided into a plurality of narrow-width ground wirings; an auxiliary power supply wiring connecting each narrow-width power supply wiring; and an auxiliary ground wiring connecting each narrow-width ground wiring.

Here, a narrow-width power supply wiring and a narrow-width ground wiring may be alternately disposed.

DETAILED DESCRIPTION OF THE PREFERRED EMBODIMENTS

An embodiment of the present invention will be described below.

Embodiment 1

Figure 2:
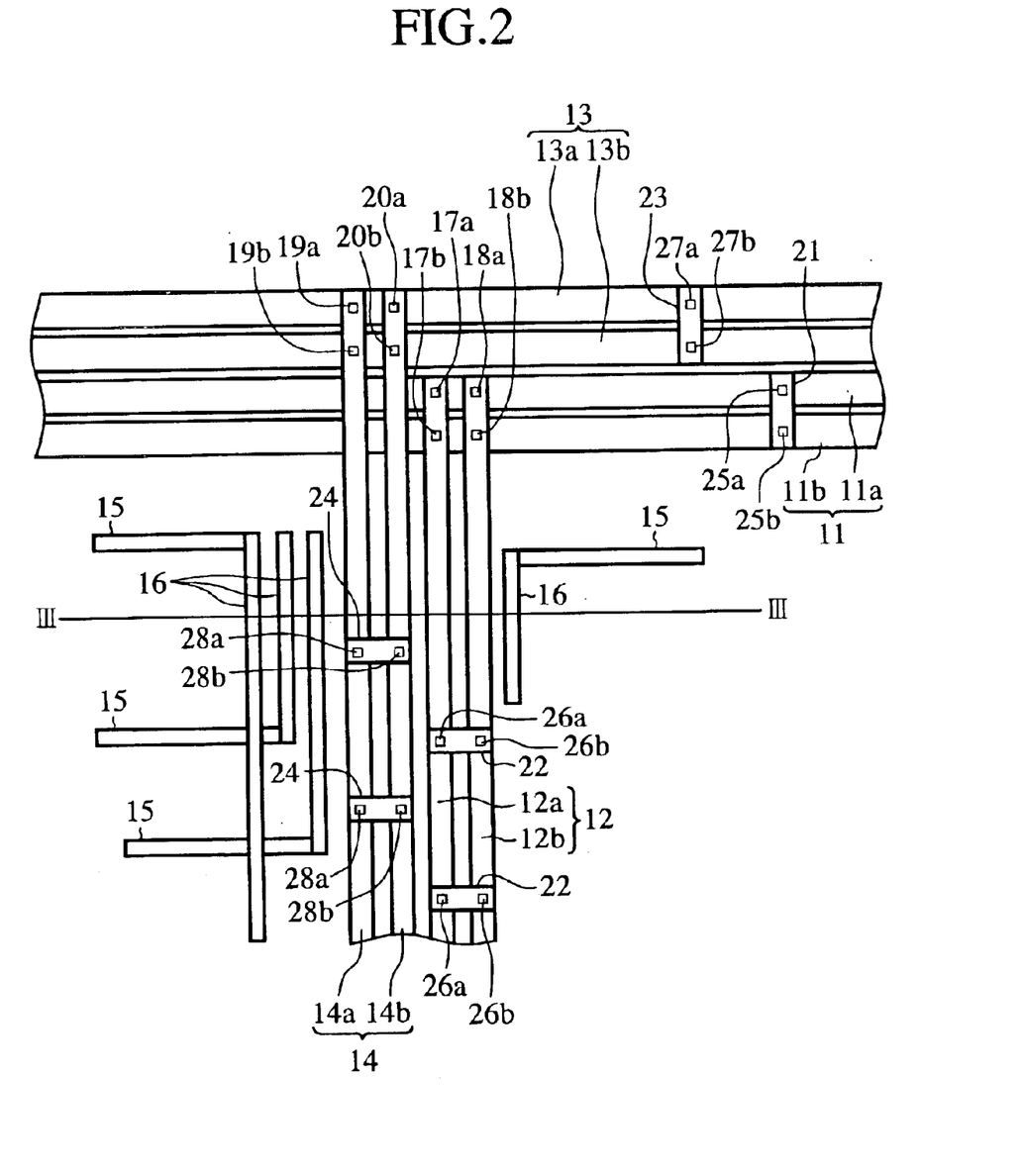
FIG. 2 is a plan view showing the configuration of wiring within the logic area of the semiconductor integrated circuit device according to an embodiment 1 of the present invention.

FIG. 2 is a plan view showing the configuration of wiring within the logic area of the semiconductor integrated circuit device according to an embodiment 1 of the present invention, and corresponds to "A" part of FIG. 1. Shown in the figure are horizontal power supply wiring 11, first and second narrow-width horizontal power supply wirings 11a and 11b constituting horizontal power supply wiring 11, vertical power supply wiring 12, first and second narrow-width vertical power supply wirings 12a and 12b constituting vertical power supply wiring 12, horizontal ground wiring 13 disposed in parallel with horizontal power supply wiring 11, first and second narrow-width horizontal ground wirings 13a and 13b constituting horizontal ground wiring 13, vertical ground wiring 14 disposed in parallel with vertical power supply wiring 12, first and second narrow-width vertical ground wirings 14a and 14b constituting vertical ground wiring 14, horizontal inter-element wiring 15 used for connecting logic elements, and vertical inter-element wiring 16 used for connecting logic elements.

The power supply wiring, ground wiring, and inter-element wiring are formed of metal such as aluminum or copper, for instance. The power supply wiring, ground wiring, and inter-element wiring are formed by etching and dissolving interlayer insulation film at the position where these wiring are formed, to form holes and then burying metal such as aluminum or copper in the holes.

In the embodiment 1, horizontal power supply wiring 11, vertical power supply wiring 12, horizontal ground wiring 13 and vertical ground wiring 14 are each divided into two wirings. First and second narrow-width horizontal power supply wirings 11a and 11b, and first and second narrow-width horizontal ground wirings 13a and 13b are disposed in the order of second narrow-width horizontal power supply wiring 11b, first narrow-width horizontal power supply wiring 11a, second narrow-width horizontal ground wiring 13b and first narrow-width horizontal ground wiring 13a. First and second narrow-width vertical power supply wirings 12a and 12b, and first and second narrow-width vertical ground wirings 14a and 14b are disposed in the order of second narrow-width vertical power supply wiring 12b, first narrow-width vertical power supply wiring 12a, second narrow-width vertical ground wiring 14b, and first narrow-width vertical ground wiring 14a.

Through holes 17a and 17b connect first and second narrow-width horizontal power supply wirings 11a and 11b, respectively, with first narrow-width vertical power supply 12a; through holes 18a and 18b connect first and second narrow-width horizontal power supply wirings 11a and 11b, respectively, with second narrow-width vertical power supply 12b; through holes 19a and 19b connect first and second narrow-width horizontal ground wirings 13a and 13b, respectively, with first narrow-width vertical ground wiring 14a; and through holes 20a and 20b connect first and second narrow-width horizontal ground wirings 13a and 13b, respectively, with second narrow-width vertical ground wiring 14b.

Auxiliary horizontal power supply wiring 21 connects first narrow-width horizontal power supply wiring 11a and second narrow-width horizontal power supply wiring 11b; auxiliary vertical power supply wiring 22 connects first narrow-width vertical power supply 12a and second narrow-width vertical power supply 12b; auxiliary horizontal ground wiring 23 connects first narrow-width horizontal ground wiring 13a and second narrow-width horizontal ground wiring 13b; auxiliary vertical ground wiring 24 connects first narrow-width vertical ground wiring 14a and second narrow-width vertical ground wiring 14b. Auxiliary horizontal power supply wiring 21, auxiliary vertical power supply wiring 22, auxiliary horizontal ground wiring 23, and auxiliary vertical ground wiring 24 are provided on horizontal power supply wirings, vertical power supply wirings, horizontal ground wirings, and vertical ground wirings, respectively, at arbitrarily spaced intervals. However, in FIG. 2, only one auxiliary horizontal power supply wiring 21 and only one auxiliary horizontal ground wiring 23 are shown, and only two auxiliary vertical power supply wirings 22 and only two auxiliary vertical ground wirings 24 are shown.

Through holes 25a and 25b connect first and second narrow-width horizontal power supply wirings 11a and 11b, respectively, with auxiliary horizontal power supply wiring 21; through holes 26a and 26b connect first and second narrow-width vertical power supply wirings 12a and 12b, respectively, with auxiliary vertical power supply wiring 22; through holes 27a and 27b connect first and second narrow-width horizontal ground wirings 13a and 13b, respectively, with auxiliary horizontal ground wiring 23; and through holes 28a and 28b connect first and second narrow-width vertical ground wirings 14a and 14b, respectively, with auxiliary vertical ground wiring 24.

Figure 3:
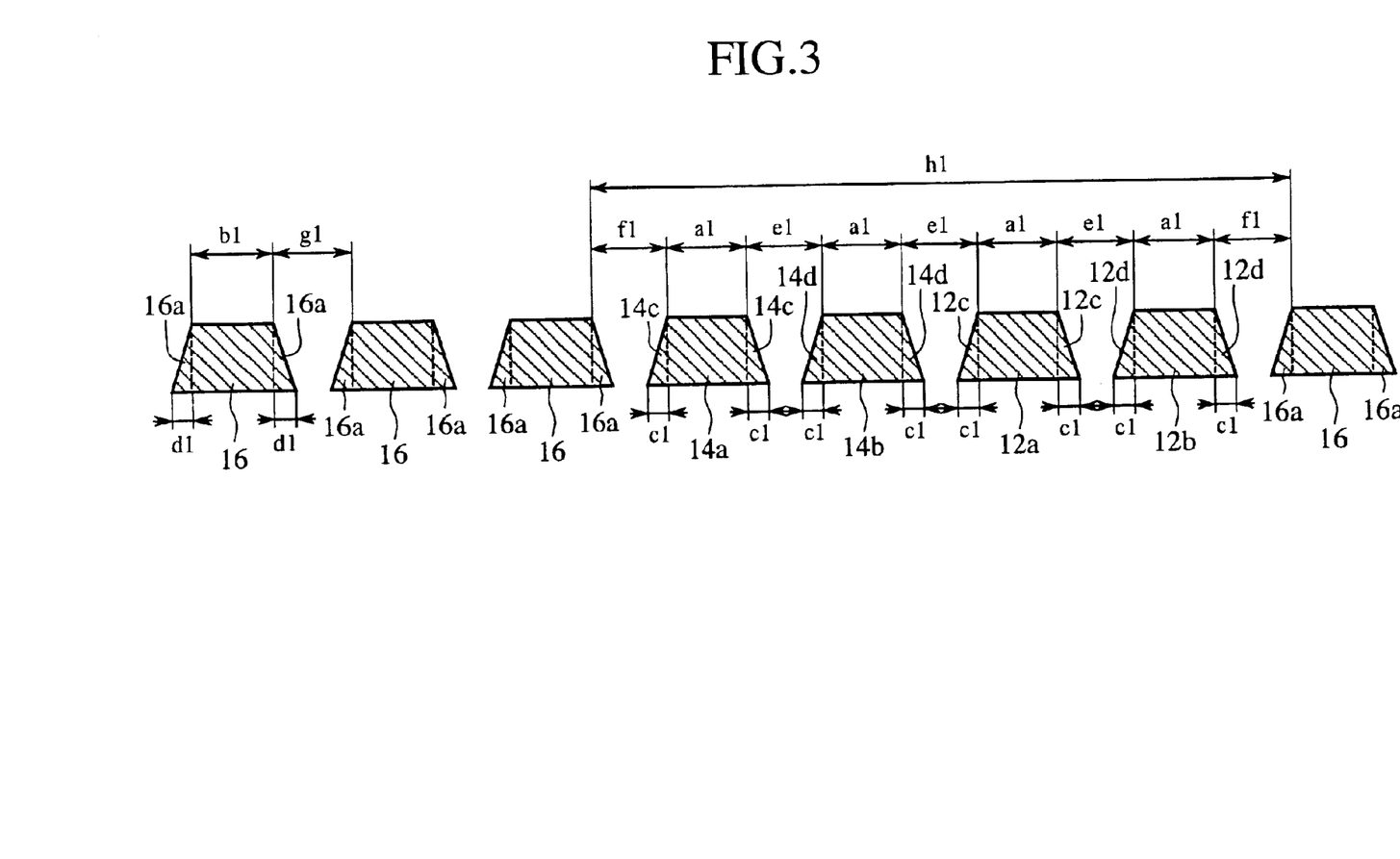
FIG. 3 is a sectional view taken along the III—III line in FIG. 2.

FIG. 3 is a sectional view taken along the III—III line of FIG. 2. Shown in the figure are taper parts 12c and 12d of first and second narrow-width vertical power supply wirings 12a and 12b, respectively; taper parts 14c and 14d of first and second narrow-width vertical ground wirings 14a and 14b, respectively; and taper part 16a of vertical inter-element wiring 16.

Widths a1 of first and second narrow-width vertical power supply wirings 12a and 12b, and of first and second narrow-width vertical ground wirings 14a and 14b is as large as width b1 of vertical inter-element wiring 16. For instance, widths a1 and b1 are about 0.22 μm. Therefore, widths c1 of taper parts 12c and 12d of first and second narrow-width vertical power supply wirings 12a and 12b, and of taper parts 14c and 14d of first and second narrow-width vertical ground wiring 14a and 14b are as large as the width d1 of taper part 16a of vertical inter-element wiring 16. Accordingly, intervals f1 between second narrow-width vertical power supply wiring 12b and vertical inter-element wiring 16, and between first narrow-width vertical ground wiring 14a and vertical inter-element wiring 16 are as large as interval g1 between vertical inter-element wirings. Intervals e1 between first narrow-width vertical power supply wiring 12a and second narrow-width vertical power supply wiring 12b, between first narrow-width vertical ground wiring 14a and second narrow-width vertical ground wiring 14b, and between first narrow-width vertical power supply wiring 12a and second narrow-width vertical ground wiring 14b are as large as interval g1. For instance, width e1, width f1, and width g1 are about 0.22 μm. Moreover, interval h1 between vertical inter-element wiring 16 that is adjacent to second narrow-width vertical power supply wiring 12b and vertical inter-element wiring 16 that is adjacent to first narrow-width vertical ground wiring 14a is 4*a1+3*e1+ 2*f1, and about 1.98 μm. This interval h1 is smaller than interval h2 in a conventional case.

As mentioned above, according to the embodiment 1, because a power supply wiring and a ground wiring each are divided into two wirings, the width of the divided individual wiring is reduced, and the width of the resultant taper part is also reduced. Therefore, the intervals between the inter-element wiring and the power supply wiring, and between the inter-element wiring and the ground wiring can be reduced. Accordingly, the effect that the wiring density of inter-element wirings increases and thereby the element density of logic elements increases is obtained. As a result, the area of semiconductor integrated circuit devices can be reduced.

Embodiment 2

Figure 4:
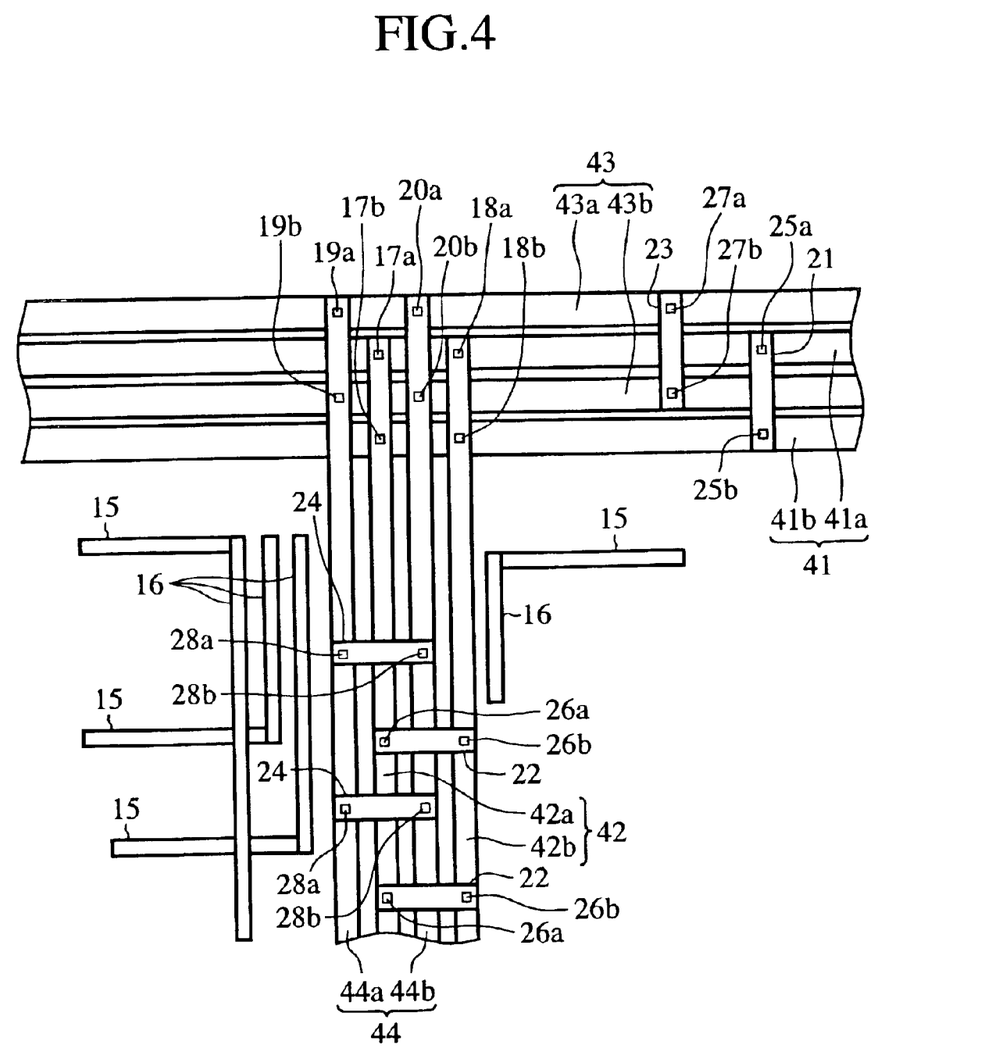
FIG. 4 is a plan view showing the configuration of wiring within the logic area of the semiconductor integrated circuit device according to an embodiment 2 of the present invention.

FIG. 4 is a plan view showing the configuration of the logic area within the semiconductor integrated circuit device according to an embodiment 2 of the present invention, and corresponds to the configuration of "A" part of FIG. 1. Shown in the figure are horizontal power supply wiring 41, first and second narrow-width horizontal power supply wirings 41a and 41b constituting horizontal power supply wiring 41, vertical power supply wiring 42, first and second narrow-width vertical power supply wirings 42a and 42b constituting vertical power supply wiring 42, horizontal ground wiring 43 disposed in parallel with horizontal power supply wiring 41, first and second narrow-width horizontal ground wirings 43a and 43b constituting horizontal ground wiring 43, vertical ground wiring 44 disposed in parallel with vertical power supply wiring 42, and first and second narrow-width vertical ground wirings 44a and 44b constituting vertical ground wiring 44. The other constituent elements are the same or the equivalent to the elements designated by the same numerals in FIG. 2.

In the embodiment 2, horizontal power supply wiring 41, vertical power supply wiring 42, horizontal ground wiring 43 and vertical ground wiring 44 are each divided into two wirings. First and second narrow-width horizontal power supply wirings 41a and 41b, and first and second narrow-width horizontal ground wirings 43a and 43b are disposed in the order of second narrow-width horizontal power supply wiring 41b, second narrow-width horizontal ground wiring 43b, first narrow-width horizontal power supply wiring 41a and first narrow-width horizontal ground wiring 43a. That is, a narrow-width horizontal power supply wiring and a narrow-width horizontal ground wiring are alternately disposed. First and second narrow-width vertical power supply wirings 42a and 42b, and first and second narrow-width vertical ground wirings 44a and 44b are disposed in the order of second narrow-width vertical power supply wiring 42b, second narrow-width vertical ground wiring 44b, first narrow-width vertical power supply wiring 42a, and first narrow-width vertical ground wiring 44a. That is, a narrow-width vertical power supply wiring and a narrow-width vertical ground wiring are alternately disposed.

As mentioned above, according to the embodiment 2, because a power supply wiring and a ground wiring are each divided into two wirings, the similar effect to that of the embodiment 1 is obtained.

Additionally, according to the embodiment 2, because a narrow-width power supply wiring and a narrow-width ground wiring are alternately disposed, the narrow-width power supply wiring, the narrow-width ground wiring, and the interlayer insulation film located therebetween establish a capacitor. Accordingly, the effect that pulse-shaped noise generated within the power supply wiring is absorbed by the capacitor, and thereby the noise reduces is obtained.

Embodiment 3

Figure 5:
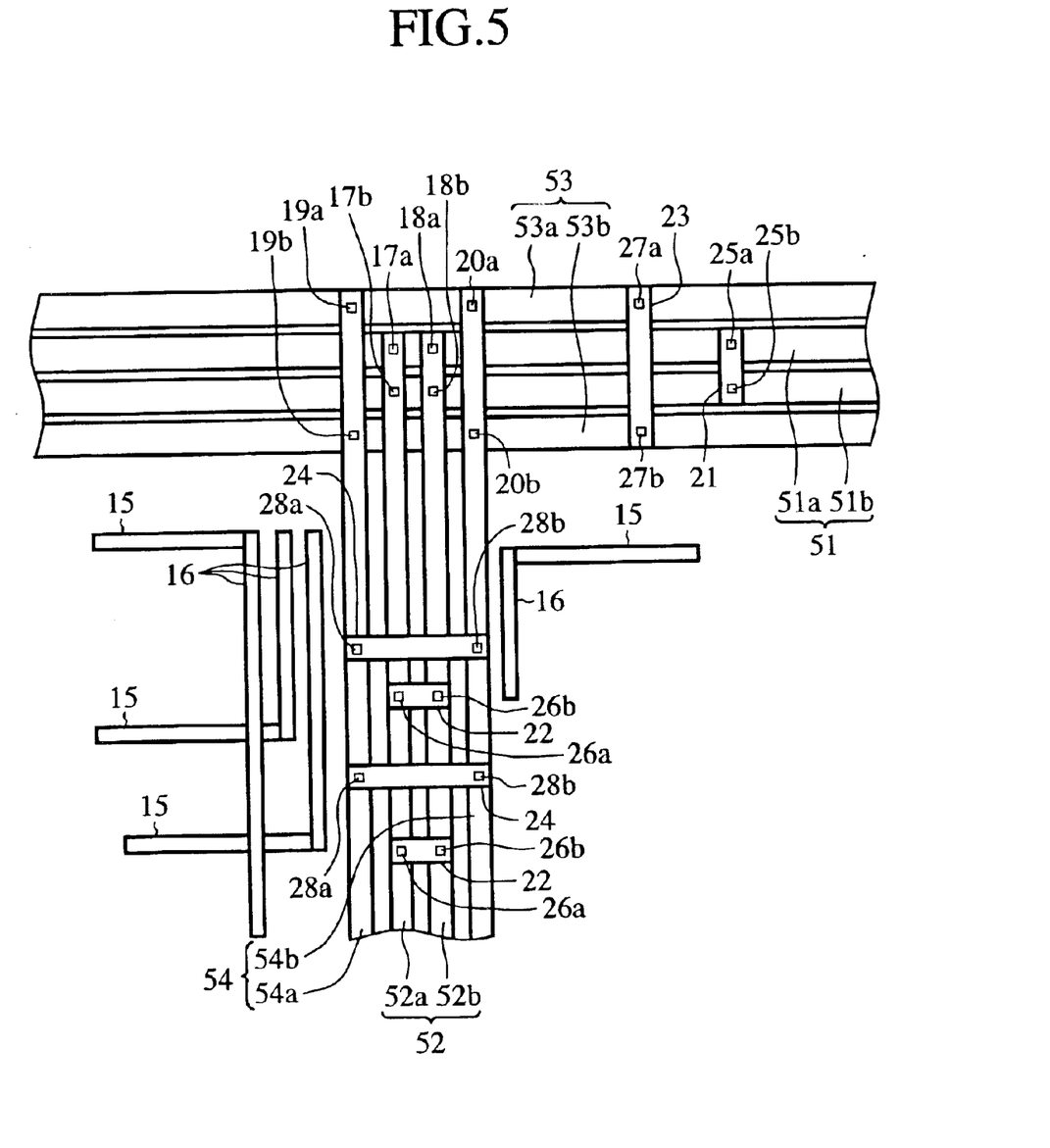
FIG. 5 is a plan view showing the configuration of wiring within the logic area of the semiconductor integrated circuit device according to an embodiment 3 of the present invention.

FIG. 5 is a plan view showing the configuration of the logic area within the semiconductor integrated circuit device according to an embodiment 3 of the present invention, and corresponds to the configuration of "A" part in FIG. 1. Shown in the figure are horizontal power supply wiring 51, first and second narrow-width horizontal power supply wirings 51a and 51b constituting horizontal power supply wiring 51, vertical power supply wiring 52, first and second narrow-width vertical power supply wirings 52a and 52b constituting vertical power supply wiring 52, horizontal ground wiring 53 disposed in parallel with horizontal power supply wiring 51, first and second narrow-width horizontal ground wirings 53a and 53b constituting horizontal ground wiring 53, vertical ground wiring 54 disposed in parallel with vertical power supply wiring 52, and first and second narrow-width vertical ground wirings 54a and 54b constituting vertical ground wiring 54. The other constituent elements are the same or the equivalent to the elements designated by the same numerals in FIG. 2.

In the embodiment 3, horizontal power supply wiring 51, vertical power supply wiring 52, horizontal ground wiring 53 and vertical ground wiring 54 are each divided into two wirings. First and second narrow-width horizontal power supply wirings 51a and 51b, and first and second narrow-width horizontal ground wirings 53a and 53b are disposed in the order of second narrow-width horizontal ground wiring 53b, second narrow-width horizontal power supply wiring 51b, first narrow-width horizontal power supply wiring 51a and first narrow-width horizontal ground wiring 53a. That is, a horizontal power supply wiring is disposed between two narrow-width horizontal ground wirings. First and second narrow-width vertical power supply wirings 52a and 52b, and first and second narrow-width vertical ground wirings 54a and 54b are disposed in the order of second narrow-width vertical ground wiring 54b, second narrow-width vertical power supply wiring 52b, first narrow-width vertical power supply wiring 52a, and first narrow-width vertical ground wiring 54a. That is, a vertical power supply wiring is disposed between two narrow-width vertical ground wirings.

As mentioned above, according to the embodiment 3 because a power supply wiring and a ground wiring are each divided into two wirings, the similar advantageous effect to that of the embodiment 1 may be obtained.

Additionally, according to the embodiment 3, because a power supply wiring is disposed between two narrow-width ground wirings, the power supply wiring is shielded by narrow-width ground wirings. Accordingly, even if voltage or current within the power supply wiring changes, the noise caused by capacitive coupling is not generated between the inter-element wirings.

In FIGS. 2–4, whereas examples in which a power supply wiring and a ground wiring are divided into two wirings were described, a power supply wiring and a ground wiring may be divided into three or more wirings, if the area of the semiconductor integrated circuit device can be reduced.

In addition, in FIGS. 2–4, whereas examples in which a vertical inter-element wiring is disposed closely to a vertical power supply wiring and a vertical ground wiring were described, it is also possible to dispose a horizontal inter-element wiring closely to a divided horizontal power supply wiring and a divided horizontal ground wiring.

Additionally, in FIGS. 2–4, whereas examples in which not only a vertical power supply wiring and a vertical ground wiring, but also a horizontal power supply wiring and a horizontal ground wiring are divided were described, it is not always necessary to divide a horizontal power supply wiring and a horizontal ground wiring when it is not necessary to dispose a horizontal inter-element wiring closely to a horizontal power supply wiring and a horizontal ground wiring.

In FIGS. 2–4, whereas examples in which an auxiliary power supply wiring and an auxiliary ground wiring are provided on a power supply wiring and a ground wiring were described, it is also possible to provide an auxiliary power supply wiring and an auxiliary ground wiring under a power supply wiring and a ground wiring.

What is claimed is:

1. A semiconductor integrated circuit device comprising:
    a power supply wiring divided into a plurality of narrow-width power supply wirings;
    a ground wiring disposed in parallel with the power supply wiring and divided into a plurality of narrow-width ground wirings, the ground wiring being formed in a same layer as that of the power supply wiring;
    an auxiliary power supply wiring connecting each narrow-width power supply wiring;
    an auxiliary ground wiring connecting each narrow-width ground wiring; and
    an inter-element wiring being adjacent to the power supply wiring and/or the ground wiring and formed in the same layer as that of the power supply wiring or the ground wiring.

2. A semiconductor integrated circuit device according to claim 1, wherein the narrow-width power supply wiring and the narrow-width ground wiring are alternately disposed.

3. A semiconductor integrated circuit device according to claim 1, wherein the power supply wiring is disposed between two narrow-width ground wirings.

4. A semiconductor integrated circuit device according to claim 1, wherein the power supply wiring and the ground wiring are each divided into two wirings.

5. A semiconductor integrated circuit device according to claim 1, wherein the auxiliary power supply wiring and the auxiliary ground wiring are formed in the layer which is distinct from that of the power supply wiring and the ground wiring, and the auxiliary power supply wiring is connected to the power supply wiring by a first through hole and the auxiliary ground wiring is connected to the ground wiring by a second through hole.

* * * * *